US008326242B2

(12) United States Patent
Rofougaran et al.

(10) Patent No.: US 8,326,242 B2
(45) Date of Patent: *Dec. 4, 2012

(54) ON-CHIP POWER MANAGEMENT FOR A MOBILE COMMUNICATION DEVICE AND METHOD FOR USE THEREWITH

(75) Inventors: Ahmadreza (Reza) Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 1749 days.

This patent is subject to a terminal disclaimer.

(21) Appl. No.: 11/643,167

(22) Filed: Dec. 20, 2006

(65) Prior Publication Data

US 2008/0151800 A1   Jun. 26, 2008

(51) Int. Cl.
*H01Q 11/12* (2006.01)
(52) U.S. Cl. ............... 455/127.1; 455/572; 455/343.1; 365/226; 365/227
(58) Field of Classification Search .............. 455/572, 455/343.1, 193.1, 296, 226.2, 114.3, 333, 455/41.1, 41.2, 552.1, 339, 194.2, 197.3, 455/556.1, 550.1, 556.2, 234.1, 266, 293, 455/76, 73; 370/311; 365/154, 226; 330/295, 330/127; 340/10.1, 10.3, 572.2; 333/193, 333/167
See application file for complete search history.

(56) References Cited

U.S. PATENT DOCUMENTS

| | | | | |
|---|---|---|---|---|
| 5,953,536 | A  * | 9/1999 | Nowlin, Jr. | 713/323 |
| 2005/0242879 | A1 * | 11/2005 | Muller | 330/259 |
| 2006/0109120 | A1 * | 5/2006 | Burr et al. | 340/572.1 |
| 2006/0136758 | A1 * | 6/2006 | Yoon | 713/300 |
| 2006/0287007 | A1 * | 12/2006 | Veselic et al. | 455/572 |
| 2008/0077818 | A1 * | 3/2008 | Rauschmayer et al. | 713/400 |
| 2012/0102340 | A1 * | 4/2012 | Cohen et al. | 713/300 |

* cited by examiner

*Primary Examiner* — Lana N Le
*Assistant Examiner* — Golam Sorowar
(74) *Attorney, Agent, or Firm* — Garlick & Markison; Bruce E. Stuckman (57) ABSTRACT

A voice data and RF integrated circuit (IC) includes a memory module that stores a least one application as a plurality of operational instructions, the at least one application having a plurality of power modes that each correspond to one of a plurality of use characteristics. A processing module executes the plurality of operational instructions and that determines a selected one of the plurality of power modes based on current use characteristics of the at least one application, and generates a power mode signal based on the selected one of the plurality of power modes. An on-chip power management circuit receives the power mode signal and that generates a plurality of power supply signals based on the power mode signal.

21 Claims, 12 Drawing Sheets

ON-CHIP POWER MANAGEMENT FOR A MOBILE COMMUNICATION DEVICE AND METHOD FOR USE THEREWITH

BACKGROUND OF THE INVENTION

1. Technical Field of the Invention

This invention relates generally to mobile communication devices and more particularly to a circuit for managing power in a combined voice, data and RF integrated circuit.

2. Description of Related Art

As is known, integrated circuits are used in a wide variety of products including, but certainly not limited to, portable electronic devices, computers, computer networking equipment, home entertainment, automotive controls and features, and home appliances. As is also known, integrated circuits include a plurality of circuits in a very small space to perform one or more fixed or programmable functions.

Power management can be an important consideration for electronic devices, particularly for mobile devices that operate from battery power. Lowering the power consumption of a device can increase battery life, or conversely, can potentially decrease the size of the battery that is required, with a corresponding decrease in weight and size.

The advantages of the present invention will be apparent to one skilled in the art when presented with the disclosure herein.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
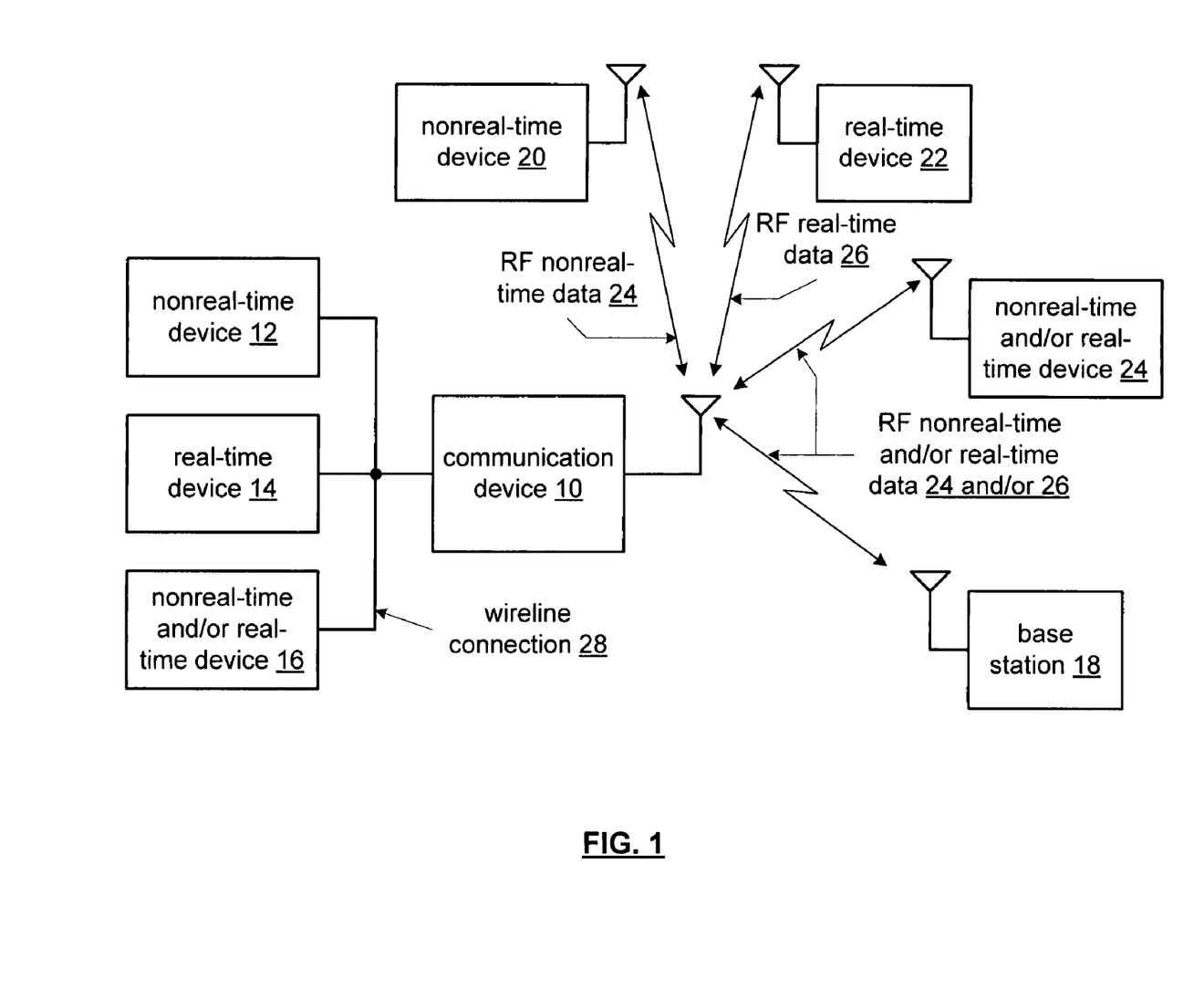
FIG. 1 is a schematic block diagram of an embodiment of a communication system in accordance with the present invention.

FIG. 1 is a schematic block diagram of an embodiment of a communication system in accordance with the present invention. In particular a communication system is shown that includes a communication device 10 that communicates real-time data 24 and non-real-time data 26 wirelessly with one or more other devices such as base station 18, non-real-time device 20, real-time device 22, and non-real-time and/or real-time device 24. In addition, communication device 10 can also optionally communicate over a wireline connection with non-real-time device 12, real-time device 14 and non-real-time and/or real-time device 16.

In an embodiment of the present invention the wireline connection 28 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as IEEE 802.11, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 10.

Communication device 10 can be a mobile phone such as a cellular telephone, a personal digital assistant, game console, personal computer, laptop computer, or other device that performs one or more functions that include communication of voice and/or data via wireline connection 28 and/or the wireless communication path. In an embodiment of the present invention, the real-time and non-real-time devices 12, 14 16, 18, 20, 22 and 24 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 26 includes voice, audio, video and multimedia applications including Internet gaming, etc. The non-real-time data 24 includes text messaging, email, web browsing, file uploading and downloading, etc.

In an embodiment of the present invention, the communication device 10 includes an integrated circuit, such as a combined voice, data and RF integrated circuit that includes one or more features or functions of the present invention. Such integrated circuits shall be described in greater detail in association with FIGS. 3-13 that follow.

Figure 2:
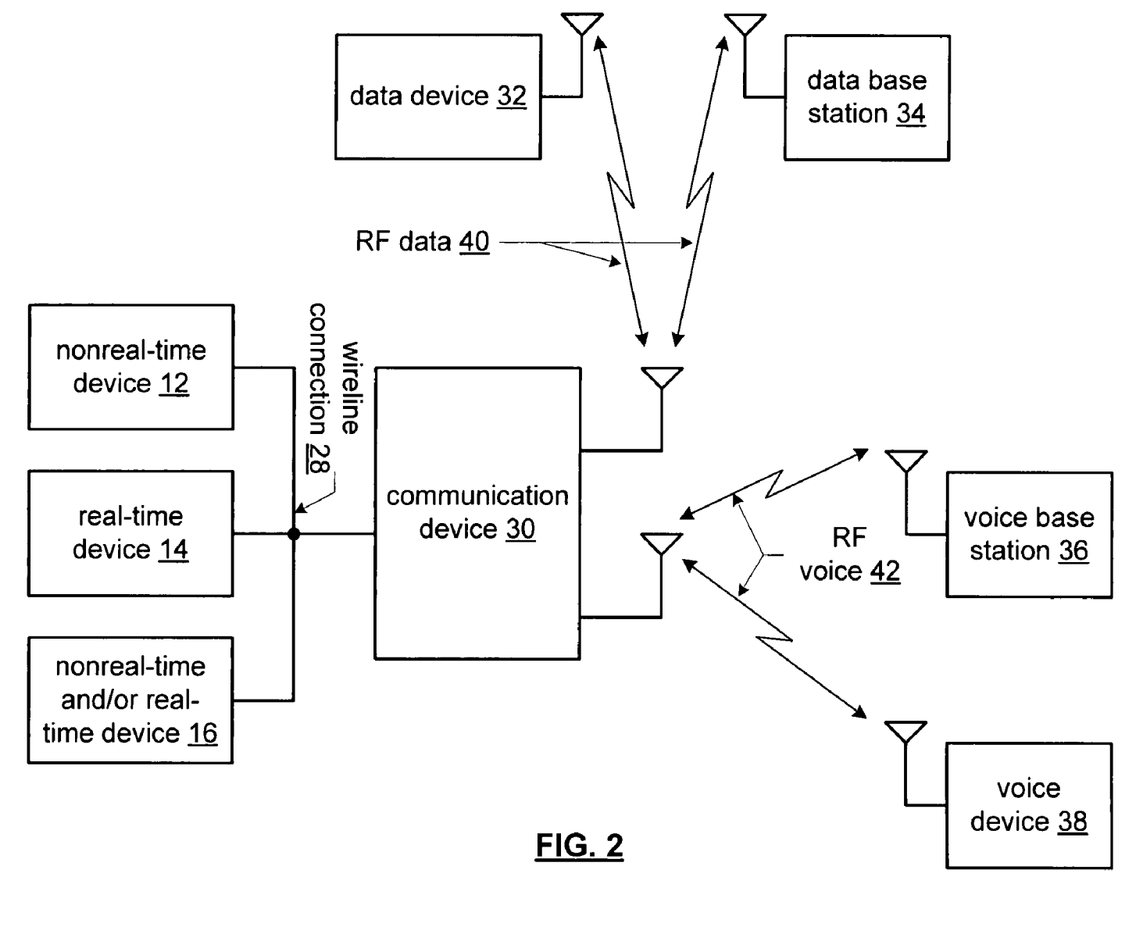
FIG. 2 is a schematic block diagram of an embodiment of another communication system in accordance with the present invention.

FIG. 2 is a schematic block diagram of an embodiment of another communication system in accordance with the present invention. In particular, FIG. 2 presents a communication system that includes many common elements of FIG. 1 that are referred to by common reference numerals. Communication device 30 is similar to communication device 10 and is capable of any of the applications, functions and features attributed to communication device 10, as discussed in conjunction with FIG. 1. However, communication device 30 includes two separate wireless transceivers for communicating, contemporaneously, via two or more wireless communication protocols with data device 32 and/or data base station 34 via RF data 40 and voice base station 36 and/or voice device 38 via RF voice signals 42.

Figure 3:
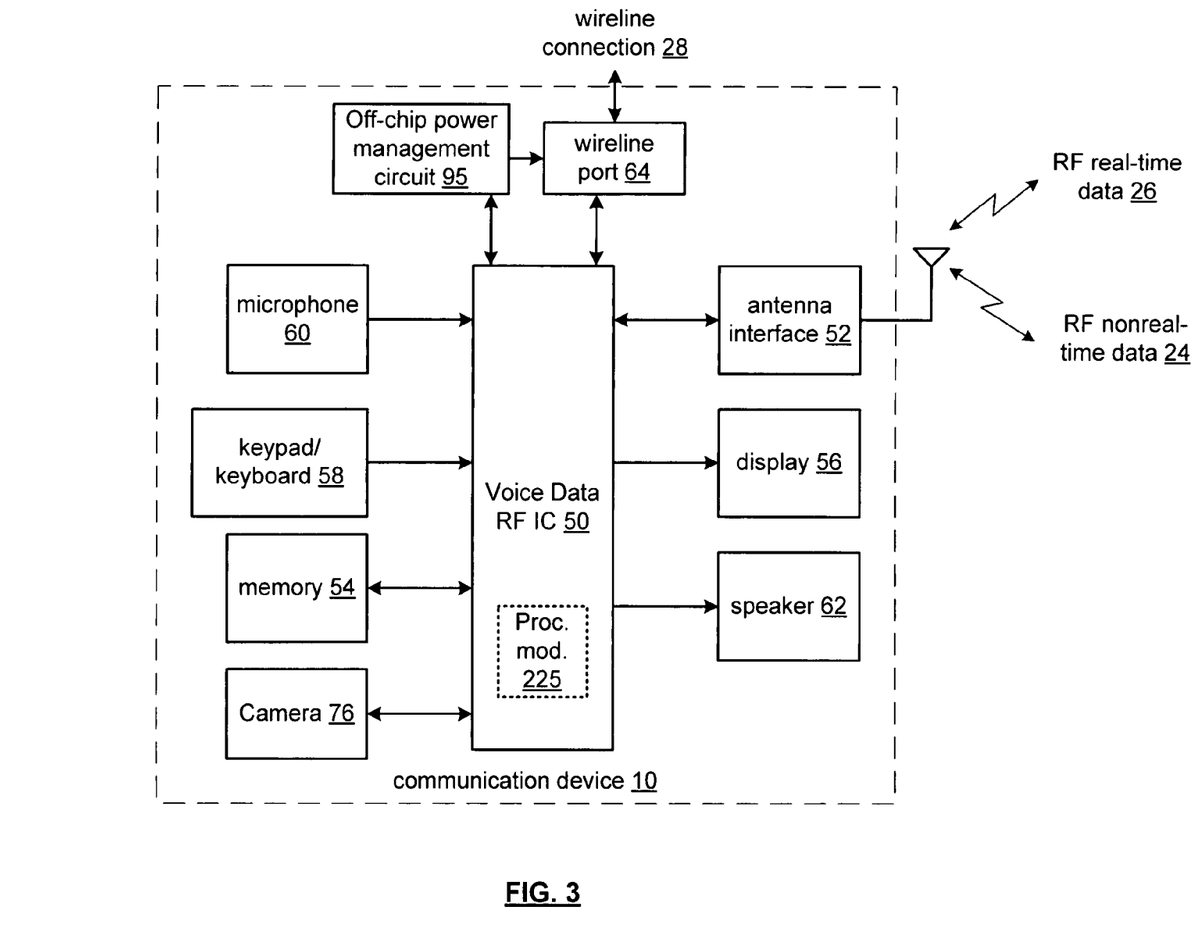
FIG. 3 is a schematic block diagram of an embodiment of an integrated circuit in accordance with the present invention.

FIG. 3 is a schematic block diagram of an embodiment of an integrated circuit in accordance with the present invention. In particular, a voice data RF integrated circuit (IC) 50 is shown that implements communication device 10 in conjunction with microphone 60, keypad/keyboard 58, memory 54, speaker 62, display 56, camera 76, antenna interface 52 and wireline port 64. In operation, voice data RF IC 50 includes RF and baseband modules for formatting and modulating data into RF real-time data 26 and non-real-time data 24 and transmitting this data via an antenna interface 52 and antenna. In addition, voice data RF IC 50 includes the appropriate encoders and decoders for communicating via the wireline connection 28 via wireline port 64, an optional memory interface for communicating with off-chip memory 54, a codec for encoding voice signals from microphone 60 into digital voice signals, a keypad/keyboard interface for generating data from keypad/keyboard 58 in response to the actions of a user, a display driver for driving display 56, such as by rendering a color video signal, text, graphics, or other display data, and an audio driver such as an audio amplifier for driving speaker 62 and one or more other interfaces, such as for interfacing with the camera 76 or the other peripheral devices.

Off-chip power management circuit 95 includes one or more DC-DC converters, voltage regulators, current regulators or other power supplies for supplying the voice data RF IC 50 and optionally the other components of communication device 10 and/or its peripheral devices with supply voltages and or currents (collectively power supply signals) that may be required to power these devices. Off-chip power management circuit 95 can operate from one or more batteries, line power and/or from other power sources, not shown. In particular, off-chip power management module can selectively supply power supply signals of different voltages, currents or current limits or with adjustable voltages, currents or current limits in response to power mode signals received from the voice data RF IC 50.

In an embodiment of the present invention, the voice data RF IC is a system on a chip integrated circuit that includes at least one processing device. Such a processing device, for instance, processing module 225, may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip such as memory 54. Such a memory device may be a read-only memory, random access memory, volatile memory, non-volatile memory, static memory, dynamic memory, flash memory, and/or any device that stores digital information. Note that when the Voice Data RF IC 50 implements one or more of its functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

In operation, the voice data RF IC 50 executes operational instructions that implement one or more of the applications (real-time or non-real-time) attributed to communication devices 10 and 30 as discussed in conjunction with FIGS. 1 and 3. Further, RF IC 50 includes power management features in accordance with the present invention that will be discussed in greater detail in association with FIG. 5.

Figure 4:
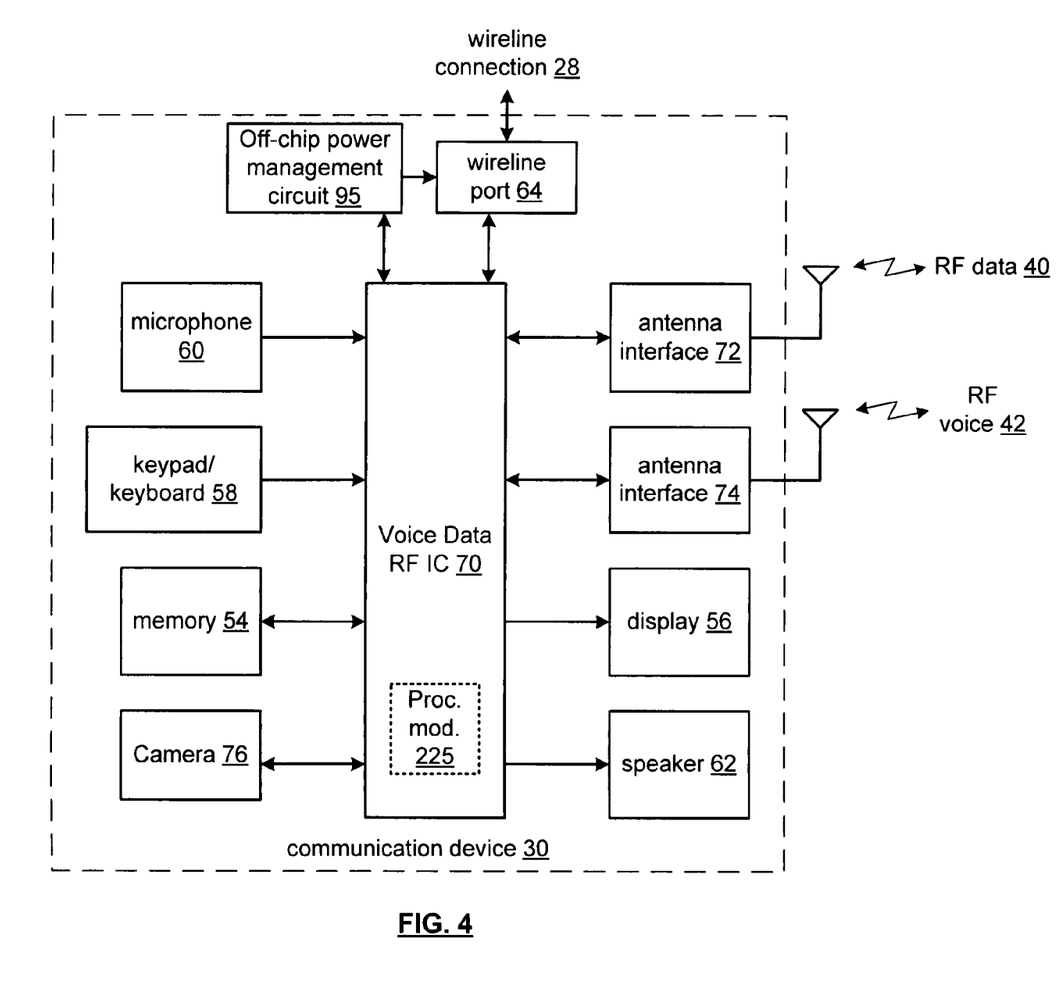
FIG. 4 is a schematic block diagram of another embodiment of an integrated circuit in accordance with the present invention.

FIG. 4 is a schematic block diagram of another embodiment of an integrated circuit in accordance with the present invention. In particular, FIG. 4 presents a communication device 30 that includes many common elements of FIG. 3 that are referred to by common reference numerals. Voice data RF IC 70 is similar to voice data RF IC 50 and is capable of any of the applications, functions and features attributed to voice data RF IC 50 as discussed in conjunction with FIG. 3. However, voice data RF IC 70 includes two separate wireless transceivers for communicating, contemporaneously, via two or more wireless communication protocols via RF data 40 and RF voice signals 42.

In operation, the voice data RF IC 70 executes operational instructions that implement one or more of the applications (real-time or non-real-time) attributed to communication device 10 as discussed in conjunction with FIG. 1. Further, RF IC 70 includes power management features in accordance with the present invention that will be discussed in greater detail in association with FIG. 5.

Figure 5:
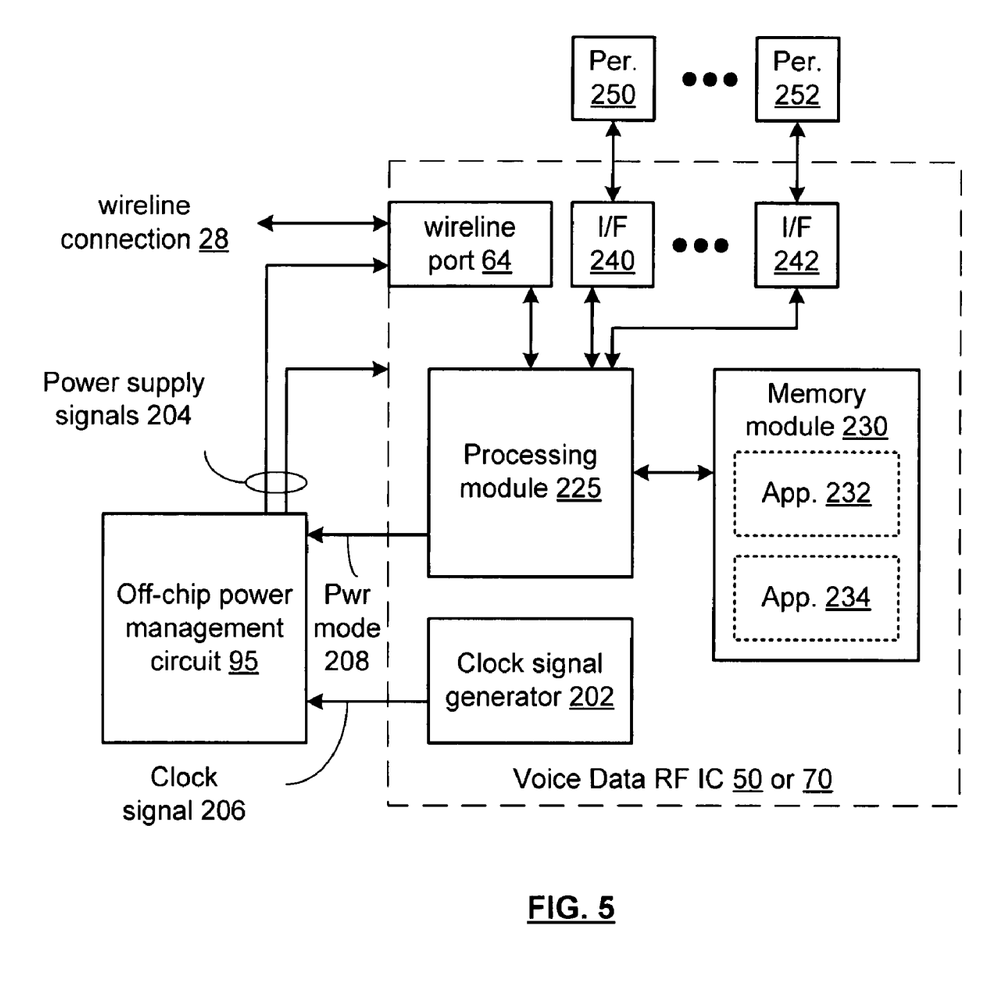
FIG. 5 is a more detailed schematic block diagram of an embodiment of power management circuitry in accordance with the present invention.

FIG. 5 is a more detailed schematic block diagram of an embodiment of power management circuitry in accordance with the present invention. In particular, selected modules of voice data RF IC 50 or 70 are shown that include processing module 225, memory module 230, wireline port 64, clock signal generator 202 and interface modules 240 and 242. In an embodiment of the present invention, memory module 230 stores a least one application, such as application 232 and/or application 234 that may include any of the applications discussed in conjunction with FIGS. 1-4, as well as other interface applications, system utilities, or other programs executed by processing module 225 to perform the functions and features of communication device 10 or 30. These applications are stored in memory module 230 and/or an off-chip memory such as memory 54, as a plurality of operational instructions. Depending on which application is being executed by the processing module 225, the use characteristics of that application at a given time may be used to determine a power mode that powers the voice data and RF IC in an efficient fashion. If communication device 10 or 30 is using certain peripheral devices and/or certain interfaces or modules at a given time, off-chip power management circuit 95 can be commanded to supply only those power supply signals that are required based on the peripheral devices, interfaces and/or other modules that are in use.

For instance, if a USB device is coupled to wireline port 64, then a power mode command can be sent to off-chip power management module 95 to generate a power supply signal 204 that supplies a power supply voltage, (such as a 5 volt, 8 milliamp supply voltage) to the wireline port 64 in order to power the USB device or devices connected thereto. In another example, if the communication device 10 includes a mobile communication device that operates in accordance with a GSM or EDGE wireless protocol, the off-chip power management circuit 95 can generate supply voltages for the baseband and RF modules of the transceiver only when the transceiver is operating. Further, peripheral devices 250, 252, etc. such as the camera 76, memory 54, keypad/keyboard 58, microphone 60, display 56, and speaker 62 can be powered through interfaces 240, 242, etc. when these peripheral devices are attached (to the extent that they can be detached) and to the extent that these devices are currently in use by the application.

The power management features of the present invention operate based on the processing module determining, for the current application being executed with corresponding current use characteristics, the current power mode of a plurality of power modes. In particular, processing module 225 when executing the application, selects a current power mode based on current use characteristics of the application, and generates a power mode signal 208 based on the selected power modes. In an embodiment of the present invention, processing module 225 maintains a register that indicates for a plurality of modules, interfaces and/or peripheral devices either, whether that device is currently being used or a power flag, such as power off, power on, high power, low power, medium power, etc, for that particular device, module and/or interface (when these devices are themselves capable in operating in different power modes). In addition, processing module, via look-up table, calculation or other processing routine, determines power mode 208 by determining the particular power supply signals required to be generated based on the devices in use and optionally their own power states.

The off-chip power management circuit 95 can be implemented as a multi-output programmable power supply, that receives the power mode signal 208 and generates and optionally routes the power supply signals 204 to particular ports, pins or pads of voice data RF IC 50 or 70 or directly to peripheral devices via a switch matrix, as commanded based on the power mode signal. In an embodiment of the present invention, the power mode signal 208 is decoded by the off-chip power management module to determine the particular power supply signals to be generated, and optionally—their characteristics such as voltage, current and/or current limit. As shown, voice data RF IC 50 or 70 optionally generates a clock signal 206 via clock signal generator 202, or otherwise couples a clock signal 206 generated off-chip to the off-chip power management circuit 95. The off-chip power management circuit 95 operates based on the clock signal 206.

As discussed above, in one example the wireline port 64 can include a universal serial bus (USB) interface module that can be selectively activated by the processing module 225 based on the current use characteristics and wherein the processing module generates the power mode signal 208 that commands the off-chip power management circuit 95 to generate a USB supply voltage as one of the power supply signals 204. Further, the off-chip power management circuit 95 can, via the generation of power supply signals 204, generate an additional supply voltage in response to the power mode signal 208, adjust a supply voltage in response to the power mode signal, and/or adjust a supply current limit in response to the power mode signal. In addition, the voice data and RF IC 95 can include an interface module such as interface modules 240, 242, etc that can be selectively activated by the processing module 225 based on the current use characteristics and wherein the processing module 225 can generate the power mode signal 208 that commands the off-chip power management circuit 95 to generate a supply voltage via power supply signals 204 to power the interface module. Further, the interface module 240, 242, etc. interfaces the voice data RF IC 50 or 70 to a peripheral device 250, 252, etc. that can be selectively activated by the processing module 225 based on the current use characteristics and wherein the processing module generates the power mode signal 208 that commands the off-chip power management circuit 95 to generate a supply voltage via power supply signals 204 to power the peripheral device.

In an embodiment of the present invention, voice data RF IC 50 or 70 couples the power mode signal 208 to the off-chip power management circuit 95 via one or more dedicated digital lines that comprise a parallel interface. Further, the voice data RF IC 50 or 70 can couple the power mode signal 208 to the off-chip power management circuit via a serial communication interface such as an I$^2$C interface, serial/deserializer (SERDES) interface or other serial interface.

The various modules and circuitry of voice data RF IC 50 or 70 that are shown in conjunction with FIG. 5 can be implemented with one or more dedicated or shared field programmable gate arrays, programmable logic devices, state machines, logic circuits, analog circuits, digital circuits, and/or any devices or other processing devices. In addition, while particular circuits and modules of voice data RF IC 50 or 70 are shown, this integrated circuit includes other modules including one or more RF modules, baseband modules, drivers and interface modules as described in conjunction with FIGS. 3 and 4 or otherwise required by communication devices 10 and 30 to perform the various functions and features associated with the broad spectrum of applications performed thereby. While a particular connection between these modules is presented, other couplings are likewise possible, particular through the use of one or more buses such as data buses.

Figure 6:
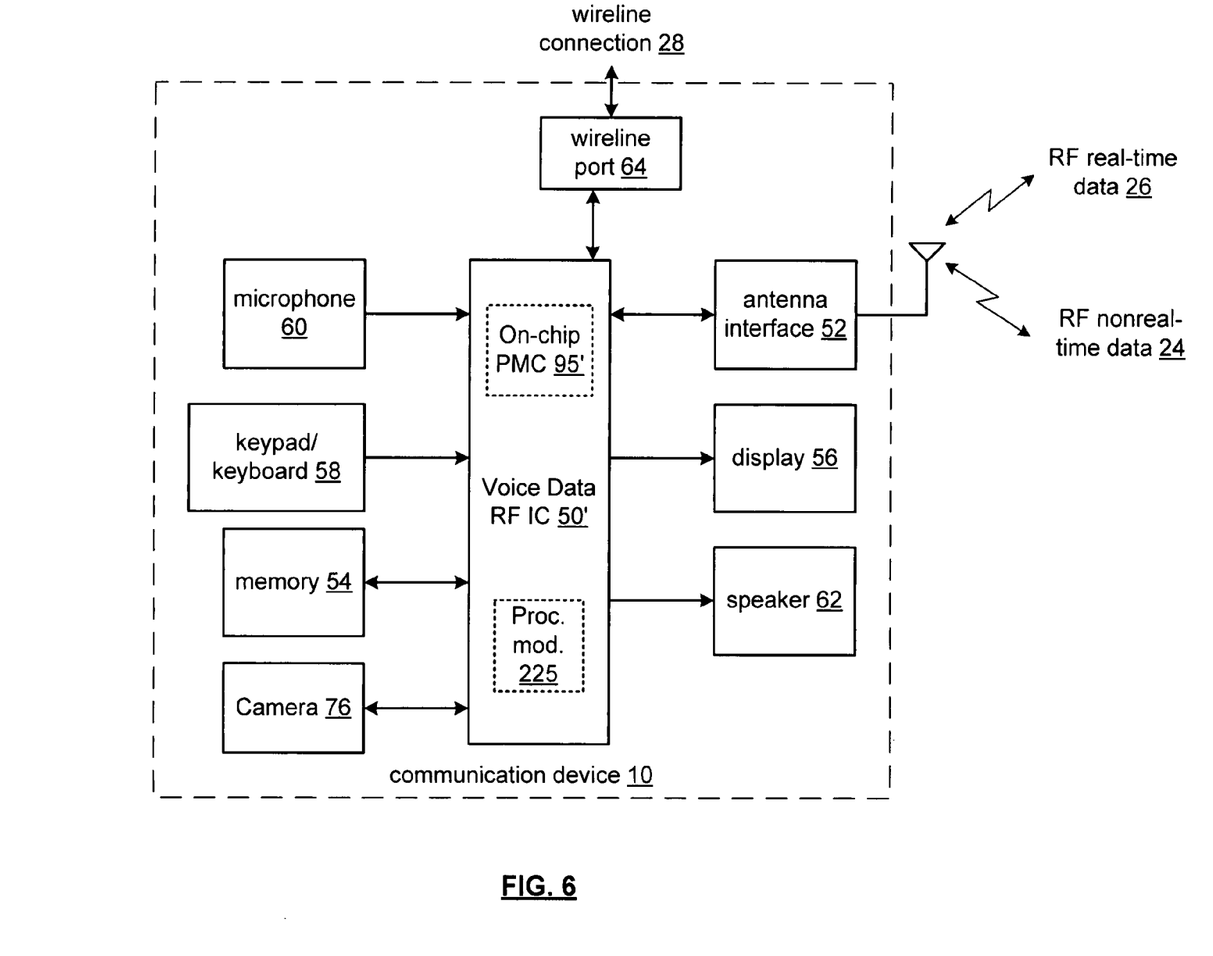
FIG. 6 is a schematic block diagram of an embodiment of an integrated circuit in accordance with the present invention.

FIG. 6 is a schematic block diagram of an embodiment of an integrated circuit in accordance with the present invention. In particular, a voice data RF integrated circuit (IC) 50' is shown that implements communication device 10 in conjunction with microphone 60, keypad/keyboard 58, memory 54, speaker 62, display 56, camera 76, antenna interface 52 and wireline port 64. In operation, voice data RF IC 50 includes RF and baseband modules for formatting and modulating data into RF real-time data 26 and non-real-time data 24 and transmitting this data via an antenna interface 52 and antenna. In addition, voice data RF IC 50' includes the appropriate encoders and decoders for communicating via the wireline connection 28 via wireline port 64, an optional memory interface for communicating with off-chip memory 54, a codec for encoding voice signals from microphone 60 into digital voice signals, a keypad/keyboard interface for generating data from keypad/keyboard 58 in response to the actions of a user, a display driver for driving display 56, such as by rendering a color video signal, text, graphics, or other display data, and an audio driver such as an audio amplifier for driving speaker 62 and one or more other interfaces, such as for interfacing with the camera 76 or the other peripheral devices.

On-chip power management circuit 95', integrated in voice data RF IC 50', includes one or more DC-DC converters, voltage regulators, current regulators or other power supplies for supplying the voice data RF IC 50', and optionally the other components of communication device 10 and/or its peripheral devices with supply voltages and/or currents (collectively power supply signals) that may be required to power these devices. On-chip power management circuit 95' can operate from one or more batteries, line power and/or from other power sources, not shown. In particular, on-chip power management module 95' can selectively supply power supply signals of different voltages, currents or current limits or with adjustable voltages, currents or current limits in response to power mode signals received from the voice data RF IC 50'.

In an embodiment of the present invention, the voice data RF IC 50' is a system on a chip integrated circuit that includes at least one processing device. Such a processing device, for instance, processing module 225, may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip such as memory 54. Such a memory device may be a read-only memory, random access memory, volatile memory, non-volatile memory, static memory, dynamic memory, flash memory, and/or any device that stores digital information. Note that when the Voice Data RF IC 50' implements one or more of its functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

In operation, the voice data RF IC 50' executes operational instructions that implement one or more of the applications (real-time or non-real-time) attributed to communication devices 10 and 30 as discussed in conjunction with FIGS. 1 and 3. Further, RF IC 50' includes power management features in accordance with the present invention that will be discussed in greater detail in association with FIG. 8.

Figure 7:
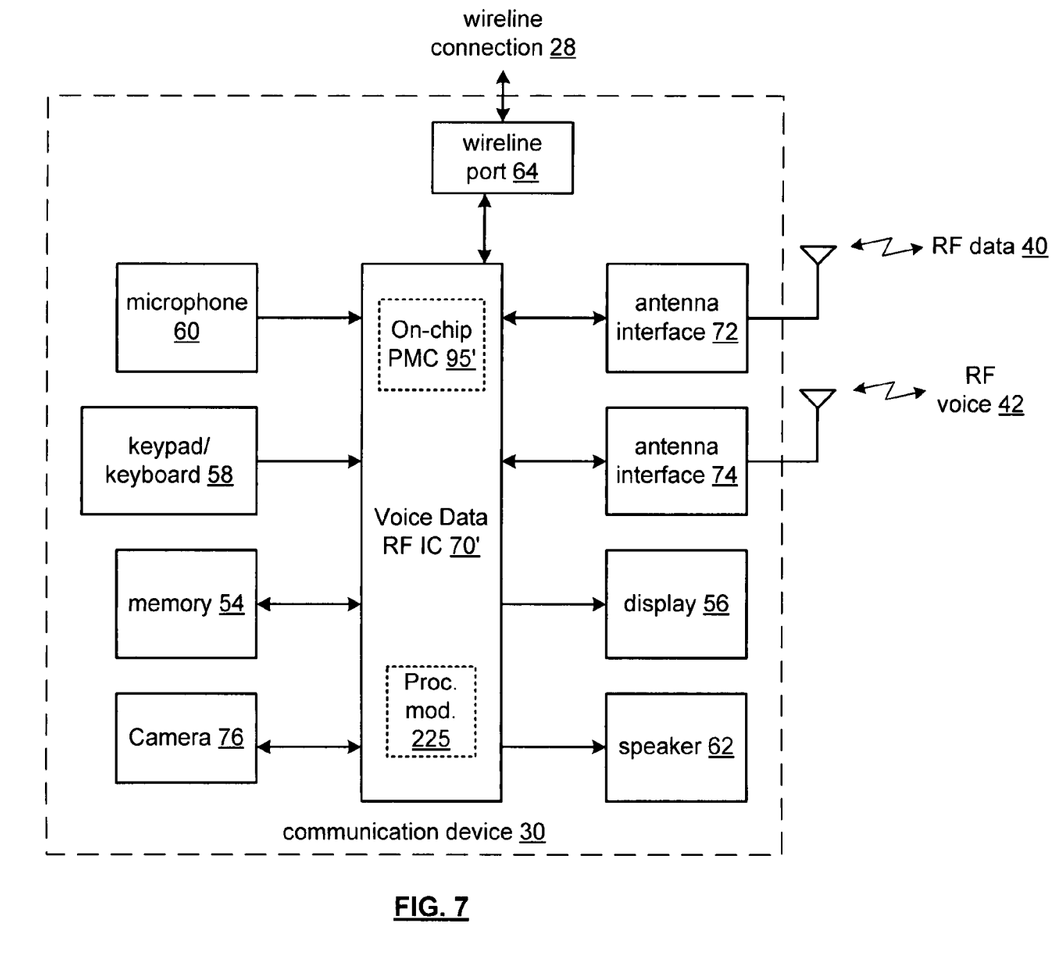
FIG. 7 is a schematic block diagram of another embodiment of an integrated circuit in accordance with the present invention.

FIG. 7 is a schematic block diagram of another embodiment of an integrated circuit in accordance with the present invention. In particular, FIG. 7 presents a communication device 30 that includes many common elements of FIG. 6 that are referred to by common reference numerals. Voice data RF IC 70' is similar to voice data RF IC 50' and is capable of any of the applications, functions and features attributed to voice data RF IC 50' as discussed in conjunction with FIG. 6. However, voice data RF IC 70' includes two separate wireless transceivers for communicating, contemporaneously, via two or more wireless communication protocols via RF data 40 and RF voice signals 42.

In operation, the voice data RF IC 70' executes operational instructions that implement one or more of the applications (real-time or non-real-time) attributed to communication device 10 as discussed in conjunction with FIG. 1. Further, RF IC 70' includes power management features in accordance with the present invention that will be discussed in greater detail in association with FIG. 8.

Figure 8:
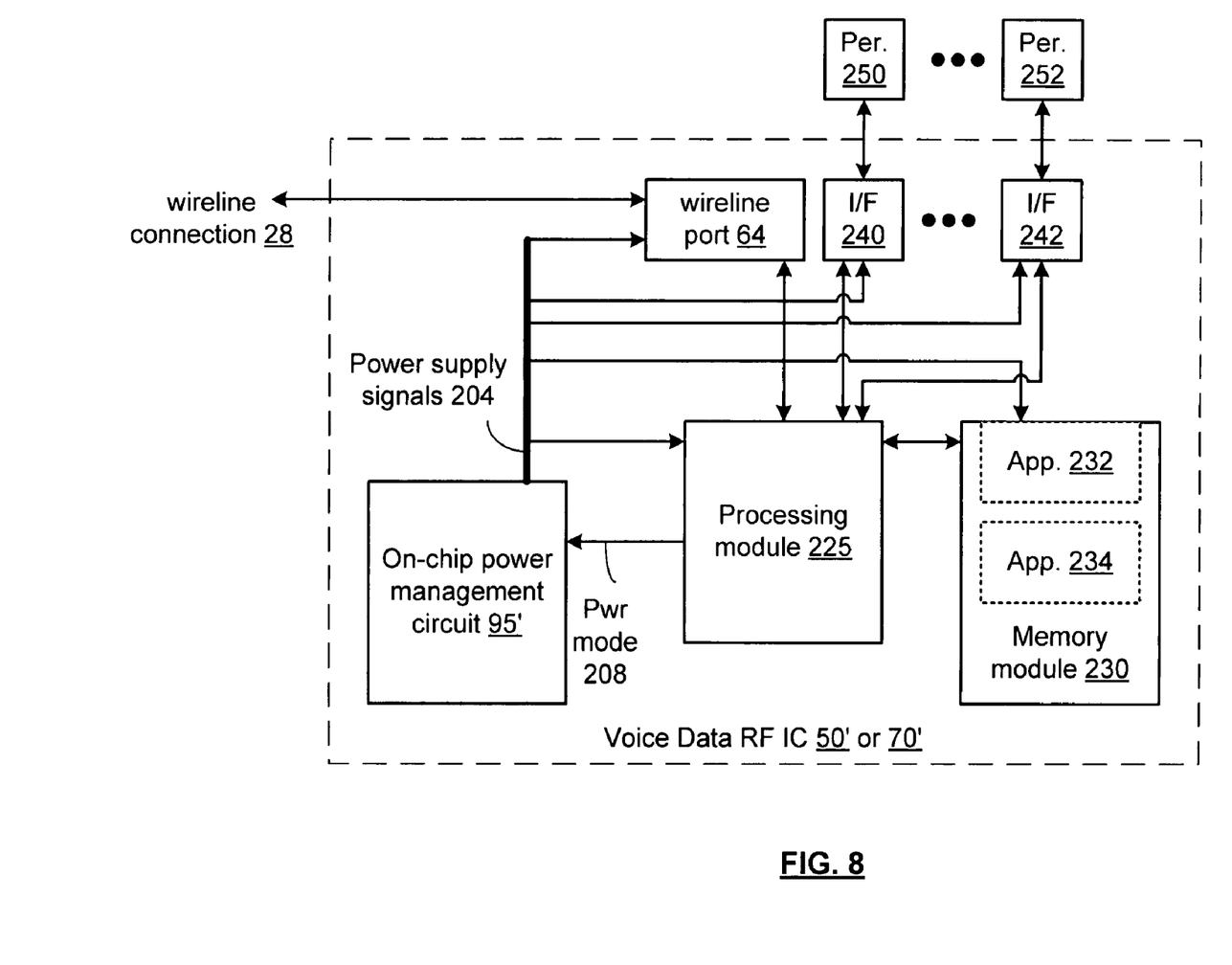
FIG. 8 is a more detailed schematic block diagram of an embodiment of power management circuitry in accordance with the present invention.

FIG. 8 is a more detailed schematic block diagram of an embodiment of power management circuitry in accordance with the present invention. In particular, selected modules of voice data RF IC 50' or 70' are shown that include processing module 225, memory module 230, wireline port 64, clock signal generator 202 and interface modules 240 and 242. In an embodiment of the present invention, memory module 230 stores a least one application, such as application 232 and/or application 234 that may include any of the applications discussed in conjunction with FIGS. 1-7, as well as other interface applications, system utilities, or other programs executed by processing module 225 to perform the functions and features of communication device 10 or 30. These applications are stored in memory module 230 and/or an off-chip memory such as memory 54, as a plurality of operational instructions. Depending on which application is being executed by the processing module 225, the use characteristics of that application at a given time may be used to determine a power mode that powers the voice data and RF IC in an efficient fashion. If communication device 10 or 30 is using certain peripheral devices and/or certain interfaces or modules at a given time, on-chip power management circuit 95' can be commanded to supply only those power supply signals that are required based on the peripheral devices, interfaces and/or other modules that are in use.

For instance, if a USB device is coupled to wireline port 64, then a power mode command can be sent to on-chip power management module 95' to generate a power supply signal 204 that supplies a power supply voltage, (such as a 5 volt, 8 milliamp supply voltage) to the wireline port 64 in order to power the USB device or devices connected thereto. In another example, if the communication device 10 includes a mobile communication device that operates in accordance with a GSM or EDGE wireless protocol, the on-chip power management circuit 95' can generate supply voltages for the baseband and RF modules of the transceiver only when the transceiver is operating. Further, peripheral devices 250, 252, etc. such as the camera 76, memory 54, keypad/keyboard 58, microphone 60, display 56, and speaker 62 can be powered through interfaces 240, 242, etc. when these peripheral devices are attached (to the extent that they can be detached) and to the extent that these devices are currently in use by the application.

The power management features of the present invention operate based on the processing module determining, for the current application being executed with corresponding current use characteristics, the current power mode of a plurality of power modes. In particular, processing module 225 when executing the application, selects a current power mode based on current use characteristics of the application, and generates a power mode signal 208 based on the selected power modes. In an embodiment of the present invention, processing module 225 maintains a register that indicates for a plurality of modules, interfaces and/or peripheral devices either, whether that device is currently being used or a power flag, such as power off, power on, high power, low power, medium power, etc, for that particular device, module and/or interface (when these devices are themselves capable in operating in different power modes). In addition, processing module, via look-up table, calculation or other processing routine, determines power mode 208 by determining the particular power supply signals required to be generated based on the devices in use and optionally their own power states.

The on-chip power management circuit 95' can be implemented as a multi-output programmable power supply, that receives the power mode signal 208 and generates and optionally routes the power supply signals 204 to the particular modules of voice data RF IC 50 or 70 or directly to peripheral devices via a switch matrix, as commanded based on the power mode signal 208. In an embodiment of the present invention, the power mode signal 208 is decoded by the on-chip power management module 95' to determine the particular power supply signals to be generated, and optionally—their characteristics such as voltage, current and/or current limit.

As discussed above, in one example the wireline port 64 can include a universal serial bus (USB) interface module that can be selectively activated by the processing module 225 based on the current use characteristics and wherein the processing module generates the power mode signal 208 that commands the on-chip power management circuit 95' to generate a USB supply voltage as one of the power supply signals 204. Further, the on-chip power management circuit 95' can, via the generation of power supply signals 204, generate an additional supply voltage in response to the power mode signal 208, adjust a supply voltage in response to the power mode signal, and/or adjust a supply current limit in response to the power mode signal. In addition, the voice data and RF IC 50' or 70' can include an interface module such as interface modules 240, 242, etc that can be selectively activated by the processing module 225 based on the current use characteristics and wherein the processing module 225 can generate the power mode signal 208 that commands the on-chip power management circuit 95' to generate a supply voltage via power supply signals 204 to power the interface module. Further, the interface module 240, 242, etc. interfaces the voice data RF IC 50' or 70' to a peripheral device 250, 252, etc. that can be selectively activated by the processing module 225 based on the current use characteristics and wherein the processing module generates the power mode signal 208 that commands the on-chip power management circuit 95' to generate a supply voltage via power supply signals 204 to power the peripheral device.

In an embodiment of the present invention, voice data RF IC 50' or 70' couples the power mode signal 208 to the on-chip power management circuit 95' via a direct connection, data bus or other interface.

The various modules and circuitry of voice data RF IC 50' or 70' that are shown in conjunction with FIG. 8 can be implemented with one or more dedicated or shared field programmable gate arrays, programmable logic devices, state machines, logic circuits, analog circuits, digital circuits, and/or any devices or other processing devices. In addition, while particular circuits and modules of voice data RF IC 50' or 70' are shown, this integrated circuit includes other modules including one or more RF modules, baseband modules, drivers and interface modules as described in conjunction with FIGS. 6 and 7 or otherwise required by communication devices 10 and 30 to perform the various functions and features associated with the broad spectrum of applications performed thereby. While a particular connection between these modules is presented, other couplings are likewise possible, particular through the use of one or more buses such as data buses.

Figure 9:
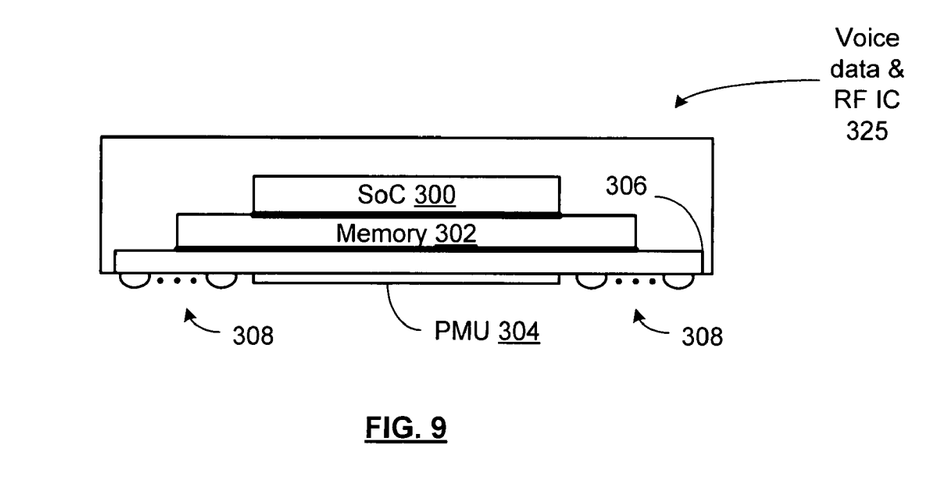
FIG. 9 is a side view of a pictorial representation of an integrated circuit package in accordance with the present invention.

FIG. 9 is a side view of a pictorial representation of an integrated circuit package in accordance with the present invention. Voice data and RF IC 325, such as voice data and RF IC 50' or 70', includes a system on a chip (SoC) die 300, a memory die 302 a substrate 306, bonding pads 308 and power management unit (PMU) 308, such as on-chip power management circuit 95'. This figure is not drawn to scale, rather it is meant to be a pictorial representation that illustrates the juxtaposition of the SoC die 300, Memory die 302, PMU 304 and the bonding pads 308. In particular, the voice data and RF IC 325 is integrated in a package with a top and a bottom having a plurality of bonding pads 308 to connect the voice data and RF IC 325 to a circuit board, and wherein the on-chip power management unit 325 is integrated along the bottom of the package. In an embodiment of the present invention, die 302 includes the memory module 230 and die 300 includes the processing module 225. These dies are stacked and die bonding is employed to connect these two circuits and minimize the number of bonding pads, (balls) out to the package. Both SoC die 300 and memory die 302 are coupled to respective ones of the bonding pads 308 via bonding wires or other connections.

PMU 304 is coupled to the SoC die 300, and/or the memory die 302 via conductive vias, bonding wires, bonding pads or by other connections. The positioning of the PMU on the bottom of the package in a flip chip configuration allows good heat dissipation of the PMU 304 to a circuit board when the voice data and RF integrated circuit is installed.

Figure 10:
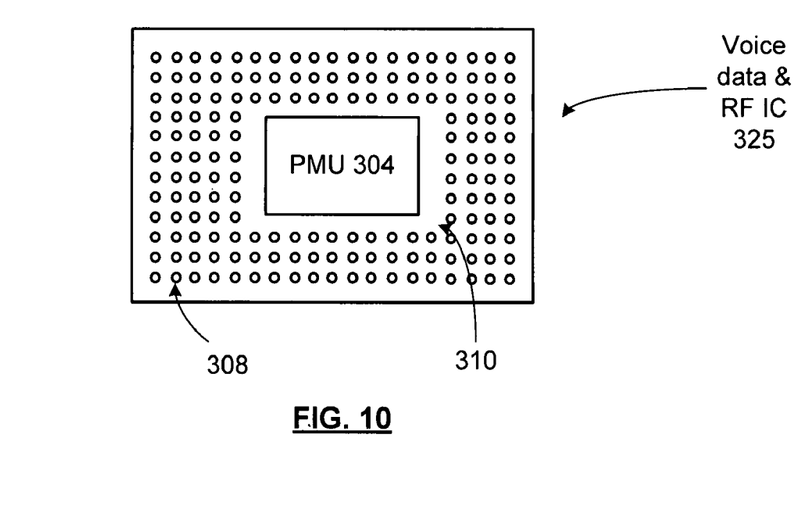
FIG. 10 is a bottom view of a pictorial representation of an integrated circuit package in accordance with the present invention.

FIG. 10 is a bottom view of a pictorial representation of an integrated circuit package in accordance with the present invention. As shown, the bonding pads (balls) 308 are arrayed in an area of the bottom of the integrated circuit with an open center portion 310 and wherein the on-chip power management unit (PMU 304) is integrated in the open center portion. While a particular pattern and number of bonding pads 308 are shown, a greater or lesser number of bonding pads can likewise be employed with alternative configurations within the broad scope of the present invention.

Figure 11:
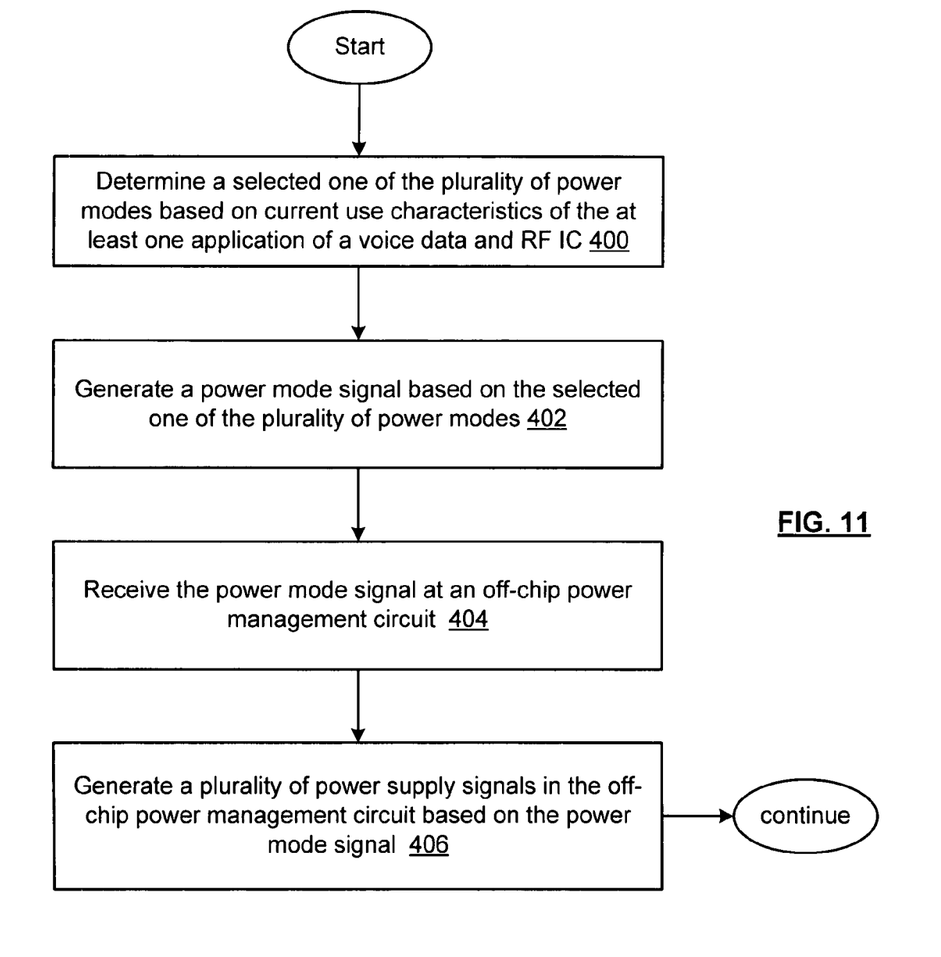
FIG. 11 is a flow chart of an embodiment of a method in accordance with the present invention.

FIG. 11 is a flow chart of an embodiment of a method in accordance with the present invention. In particular, a method is presented for use in conjunction with one or more of the functions and features described in conjunction with FIGS. 1-5. In step 400, a selected one of the plurality of power modes is determined based on current use characteristics of the at least one application of a voice data and RF integrated circuit (IC). In step 402, a power mode signal is generated based on the selected one of the plurality of power modes. In step 404, the power mode signal is received at an off-chip power management circuit. In step 406, a plurality of power supply signals are generated in the off-chip power management circuit based on the power mode signal.

In an embodiment of the present invention, the voice data and RF IC includes a universal serial bus (USB) interface module that can be selectively activated by the processing module based on the current use characteristics and wherein step 402 generates the power mode signal that commands the off-chip power management circuit to generate a USB supply voltage. In addition, step 406 can include generating an additional supply voltage in response to the power mode signal, generating a plurality of power supply signals, adjusting a supply voltage in response to the power mode signal, and/or adjusting a supply current limit in response to the power mode signal. Optionally, step 404 includes of receiving the power mode signal via a serial communication interface.

In an embodiment, the voice data and RF IC includes an interface module that can be selectively activated by the processing module based on the current use characteristics and wherein step 402 generates the power mode signal that commands the off-chip power management circuit to generate a supply voltage to power the interface module. In addition, the interface module can interface the voice data RF IC to a peripheral device that can be selectively activated by the processing module based on the current use characteristics and step 402 can generate a power mode signal that commands the off-chip power management circuit to generate a supply voltage to power the peripheral device.

Figure 12:
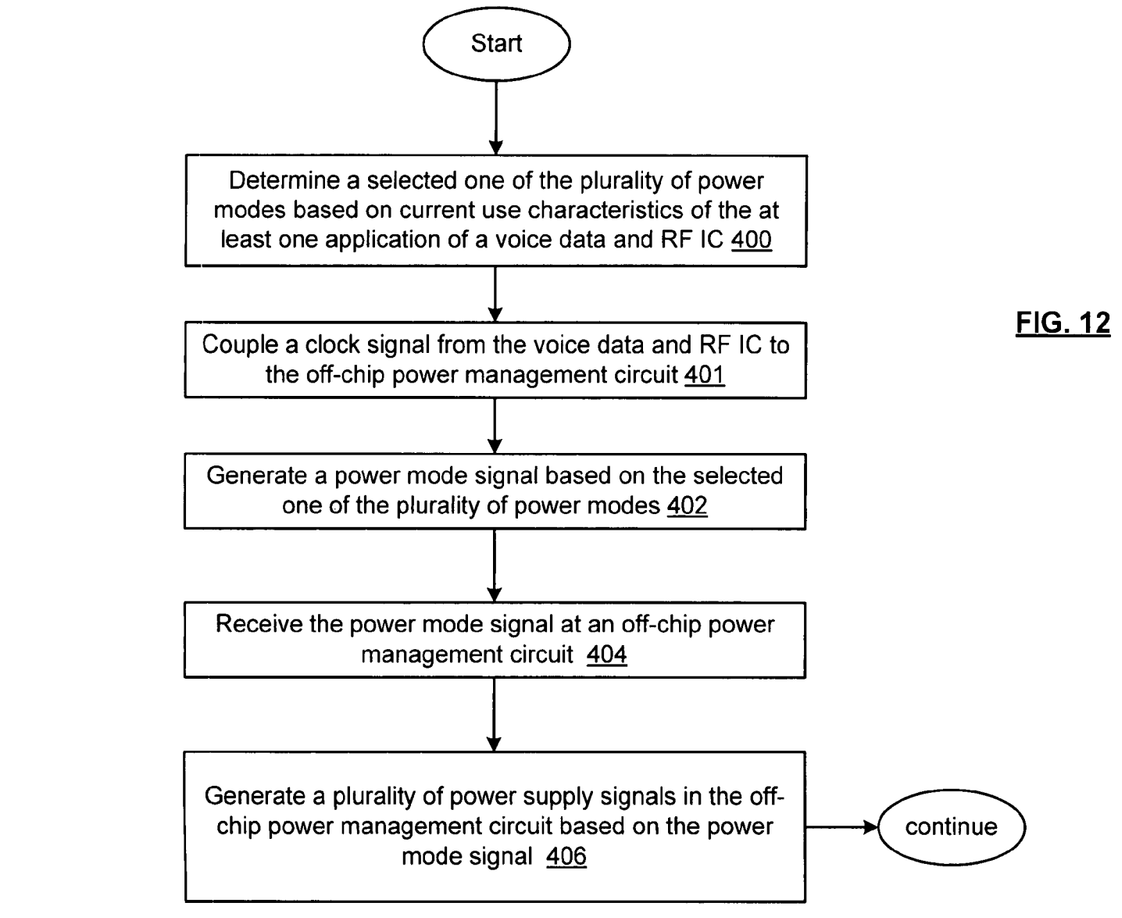
FIG. 12 is a flow chart of an embodiment of a method in accordance with the present invention.

FIG. 12 is a flow chart of an embodiment of a method in accordance with the present invention. In particular, a method is presented that includes many of the steps of FIG. 11 that are referred to by common reference numerals. In addition, the method includes step 401 of coupling a clock signal from the voice data and RF IC to the off-chip power management circuit.

Figure 13:
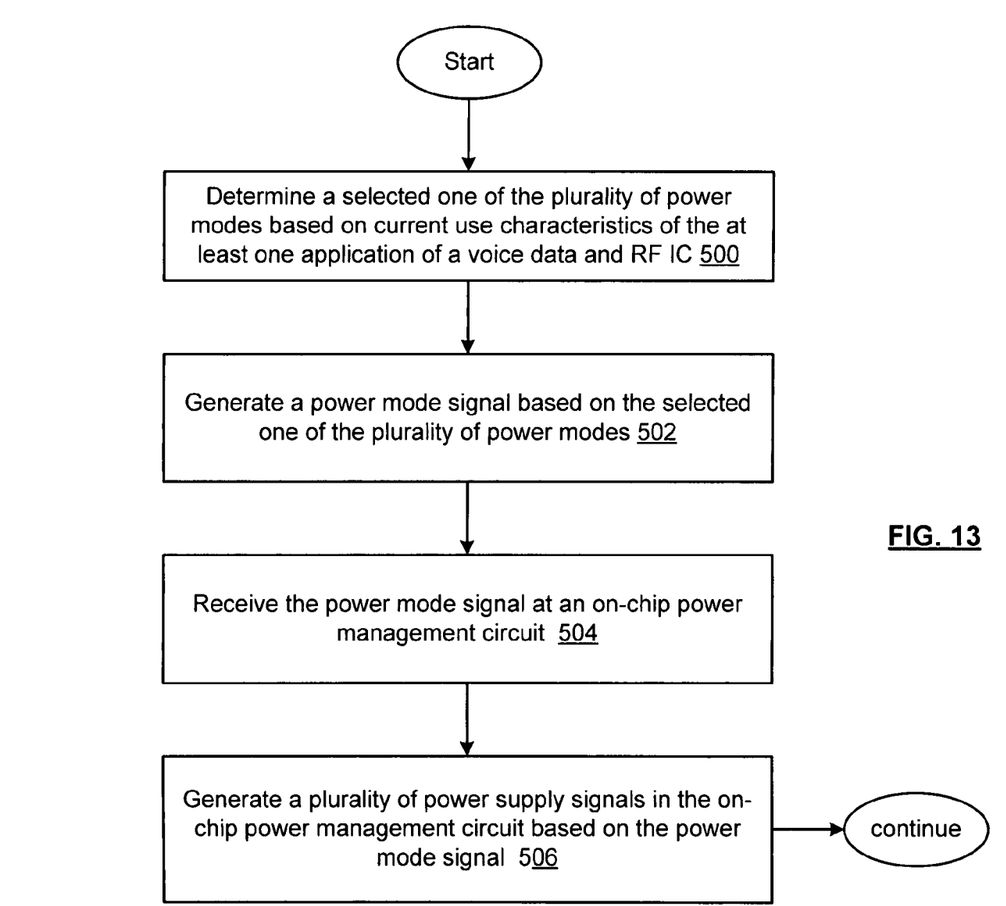
FIG. 13 is a flow chart of an embodiment of a method in accordance with the present invention.

FIG. 13 is a flow chart of an embodiment of a method in accordance with the present invention. In particular, a method is presented for use in conjunction with one or more of the functions and features described in conjunction with FIGS. 1-10. In step 500, a selected one of the plurality of power modes is determined based on current use characteristics of the at least one application of a voice data and RF integrated circuit (IC). In step 502, a power mode signal is generated based on the selected one of the plurality of power modes. In step 504, the power mode signal is received at an on-chip power management circuit. In step 506, a plurality of power supply signals are generated in the on-chip power management circuit based on the power mode signal.

In an embodiment of the present invention, the voice data and RF IC includes a universal serial bus (USB) interface module that can be selectively activated by the processing module based on the current use characteristics and wherein step 402 generates the power mode signal that commands the on-chip power management circuit to generate a USB supply voltage. In addition, step 506 can include generating an additional supply voltage in response to the power mode signal, generating a plurality of power supply signals, adjusting a supply voltage in response to the power mode signal, and/or adjusting a supply current limit in response to the power mode signal.

In an embodiment, the voice data and RF IC includes an interface module that can be selectively activated by the processing module based on the current use characteristics and wherein step 502 generates the power mode signal that commands the on-chip power management circuit to generate a supply voltage to power the interface module. In addition, the interface module can interface the voice data RF IC to a peripheral device that can be selectively activated by the processing module based on the current use characteristics and step 502 can generate a power mode signal that commands the off-chip power management circuit to generate a supply voltage to power the peripheral device.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A voice data and RF integrated circuit (IC) comprising:
   a memory module that stores a least one application as a plurality of operational instructions, the at least one application having a plurality of power modes that each correspond to one of a plurality of use characteristics;
   a processing module, coupled to the memory module, that executes the plurality of operational instructions and that determines a selected one of the plurality of power modes based on current use characteristics of the at least one application, and generates a power mode signal based on the selected one of the plurality of power modes; and
   an on-chip power management circuit, coupled to the processing module, that receives the power mode signal and that generates a plurality of power supply signals based on the power mode signal;
   wherein the voice data and RF IC is integrated in a package with a top and a bottom having a plurality of bonding pads to connect the voice data and RF IC to a circuit board, wherein the on-chip power management unit is integrated along the bottom of the package and wherein the bonding pads are arrayed in an area of the bottom with an open center portion and wherein the on-chip power management unit is integrated in the open center portion.

2. The voice data and RF IC of claim 1 further comprising:
   a universal serial bus (USB) interface module that can be selectively activated by the processing module based on the current use characteristics and wherein the processing module generates the power mode signal that commands the on-chip power management circuit to generate a USB supply voltage.

3. The voice data and RF IC of claim 1 wherein the on-chip power management circuit generates an additional supply voltage in response to the power mode signal.

4. The voice data and RF IC of claim 1 wherein the on-chip power management circuit adjusts a supply voltage in response to the power mode signal.

5. The voice data and RF IC of claim 1 wherein the on-chip power management circuit adjusts a supply current limit in response to the power mode signal.

6. The voice data and RF IC of claim 1 further comprising:
an interface module that can be selectively activated by the processing module based on the current use characteristics and wherein the processing module generates the power mode signal that commands the on-chip power management circuit to generate a supply voltage to power the interface module.

7. The voice data and RF IC of claim 6 wherein the interface module interfaces the voice data RF IC to a peripheral device that can be selectively activated by the processing module based on the current use characteristics and wherein the processing module generates the power mode signal that commands the on-chip power management circuit to generate a supply voltage to power the peripheral device.

8. The voice data and RF IC of claim 1 wherein the package includes a first die that includes the memory module and a second die that includes the processing module and wherein the first die and the second die are stacked.

9. A voice data and RF integrated circuit (IC) that integrated in a package with a top and a bottom having a plurality of bonding pads to connect the voice data and RF IC to a circuit board, the voice data and RF IC comprising:
a memory module that stores a least one application as a plurality of operational instructions, the at least one application having a plurality of power modes that each correspond to one of a plurality of use characteristics;
a processing module, coupled to the memory module, that executes the plurality of operational instructions and that determines a selected one of the plurality of power modes based on current use characteristics of the at least one application, and generates a power mode signal based on the selected one of the plurality of power modes; and
an on-chip power management circuit, coupled to the processing module, that receives the power mode signal and that generates a plurality of power supply signals based on the power mode signal; and
an interface module that can be selectively activated by the processing module based on the current use characteristics and wherein the processing module generates the power mode signal that commands the on-chip power management circuit to generate a supply voltage to power the interface module;
wherein the on-chip power management unit is integrated along the bottom of the package.

10. The voice data and RF IC of claim 9 further comprising:
a universal serial bus (USB) interface module that can be selectively activated by the processing module based on the current use characteristics and wherein the processing module generates the power mode signal that commands the on-chip power management circuit to generate a USB supply voltage.

11. The voice data and RF IC of claim 9 wherein the on-chip power management circuit generates an additional supply voltage in response to the power mode signal.

12. The voice data and RF IC of claim 9 wherein the on-chip power management circuit adjusts a supply voltage in response to the power mode signal.

13. The voice data and RF IC of claim 9 wherein the on-chip power management circuit adjusts a supply current limit in response to the power mode signal.

14. The voice data and RF IC of claim 9 wherein the interface module interfaces the voice data RF IC to a peripheral device that can be selectively activated by the processing module based on the current use characteristics and wherein the processing module generates the power mode signal that commands the on-chip power management circuit to generate a supply voltage to power the peripheral device.

15. The voice data and RF IC of claim 9 wherein the bonding pads are arrayed in an area of the bottom with an open center portion and wherein the on-chip power management unit is integrated in the open center portion.

16. The voice data and RF IC of claim 9 wherein the package includes a first die that includes the memory module and a second die that includes the processing module and wherein the first die and the second die are stacked.

17. A method comprising:
determining a selected one of the plurality of power modes based on current use characteristics of the at least one application of a voice data and RF integrated circuit (IC) wherein the voice data and RF IC includes an interface module that can be selectively activated by a processing module based on the current use characteristics, wherein the interface module interfaces the voice data RF IC to a peripheral device that can be selectively activated by the processing module based on the current use characteristics;
generating a power mode signal based on the selected one of the plurality of power modes to command an on-chip power management circuit to generate a supply voltage to power the interface module and the peripheral device;
receiving the power mode signal at the on-chip power management circuit; and
generating a plurality of power supply signals in the on-chip power management circuit based on the power mode signal, wherein the plurality of power supply signals include the voltage to power the interface module and the peripheral device.

18. The method of claim 17 wherein the voice data and RF IC includes a universal serial bus (USB) interface module that can be selectively activated by the processing module based on the current use characteristics and wherein the step of generating the power mode signal generates the power mode signal that commands the on-chip power management circuit to generate a USB supply voltage.

19. The method of claim 17 wherein the step of generating a plurality of power supply signals includes generating an additional supply voltage in response to the power mode signal.

20. The method of claim 17 wherein the step of generating a plurality of power supply signals adjusts a supply voltage in response to the power mode signal.

21. The method of claim 17 wherein the step of generating a plurality of power supply signals adjusts a supply current limit in response to the power mode signal.

* * * * *